(12) United States Patent
Liu et al.

(10) Patent No.: US 12,432,983 B2
(45) Date of Patent: Sep. 30, 2025

(54) THIN-FILM TRANSISTOR DEVICE

(71) Applicant: National Yang Ming Chiao Tung University, Hsinchu (TW)

(72) Inventors: Po-Tsun Liu, Hsinchu (TW); Zhen-Hao Li, Tainan (TW); Tsung-Che Chiang, Taoyuan (TW); Po-Yi Kuo, Hengchun Township (TW)

(73) Assignee: National Yang Ming Chiao Tung University, Hsinchu (TW)

( * ) Notice: Subject to any disclaimer, the term of this patent is extended or adjusted under 35 U.S.C. 154(b) by 384 days.

(21) Appl. No.: 18/045,878

(22) Filed: Oct. 12, 2022

(65) Prior Publication Data

US 2023/0178660 A1 Jun. 8, 2023

(30) Foreign Application Priority Data

Dec. 7, 2021 (TW) ................. 110145689

(51) Int. Cl.
*H10D 30/67* (2025.01)
(52) U.S. Cl.
CPC ..... *H10D 30/6757* (2025.01); *H10D 30/6745* (2025.01); *H10D 30/6756* (2025.01)
(58) Field of Classification Search
CPC ......... H01L 29/78696; H01L 29/78672; H01L 29/78693; H01L 27/1225; H10D 30/6757; H10D 30/6745; H10D 30/6756; H10D 86/423; H10D 86/60
See application file for complete search history.

(56) References Cited

U.S. PATENT DOCUMENTS

| 8,026,506 B2 | 9/2011 | Shiino et al. |
| 10,559,696 B2 | 2/2020 | Zhang et al. |
| 2010/0038641 A1* | 2/2010 | Imai .................... H01L 29/7869 |
| | | 257/E29.29 |
| 2011/0309411 A1* | 12/2011 | Takemura ......... H01L 29/66969 |
| | | 257/192 |
| 2013/0240886 A1* | 9/2013 | Yeh ..................... H01L 27/1222 |
| | | 257/57 |

(Continued)

OTHER PUBLICATIONS

Takio Kizu et al., "Low-temperature processable amorphous In—W—O thin-film transistors with high mobility and stability," Applied Physics Letters, 104, pp. 152103-1~152103-5, 2014.

(Continued)

*Primary Examiner* — William B Partridge
*Assistant Examiner* — Erik A. Anderson
(74) *Attorney, Agent, or Firm* — Osha Bergman Watanabe & Burton LLP

(57) ABSTRACT

A thin-film transistor includes a substrate, a first thin-film structure, a gate structure, and a second thin-film structure that are sequentially disposed on one another. The first thin-film structure includes a channel layer, and first source and drain layers disposed at opposite sides of the channel layer. The gate structure includes a common gate electrode disposed on the channel layer, and a gate insulating layer wrapping the common gate electrode and covering the first thin-film structure. The second thin-film structure includes an active layer disposed on the gate insulating layer and including an indium oxide-based material, and second source and drain layers disposed at opposite sides of the active layer.

10 Claims, 7 Drawing Sheets

(56) References Cited

U.S. PATENT DOCUMENTS

| | | |
|---|---|---|
| 2015/0055051 A1 | 2/2015 | Osawa et al. |
| 2018/0061867 A1 | 3/2018 | Chang et al. |
| 2018/0069098 A1* | 3/2018 | Deng ............... H01L 29/66757 |
| 2018/0090624 A1* | 3/2018 | Cheng .............. H01L 29/78687 |
| 2018/0144685 A1* | 5/2018 | Gong ................ H10K 59/1213 |
| 2018/0158960 A1* | 6/2018 | Huo .................. H01L 29/42356 |
| 2020/0325072 A1* | 10/2020 | Inoue ....................... C04B 35/01 |
| 2020/0350167 A1* | 11/2020 | Chen ................... C23C 14/5806 |
| 2022/0077261 A1* | 3/2022 | Seo ...................... H10K 59/124 |
| 2023/0138939 A1* | 5/2023 | Wu ........................ H10B 51/40 |
| | | 257/295 |

OTHER PUBLICATIONS

Jean-Pierre Colinge et al., "Nanowire transistors without junctions," Nature Nanotechnology, 5, pp. 225-229, 2010.

D. Matsubayashi et al., "20-nm-node trench-gate-self-aligned crystalline In—Ga—Zn-Oxide FET with high frequency and low off-state current," Proc. IEEE IEDM, pp. 141-144, 2015.

H. Kim et al., "A High-Gain Inverter With Low-Temperature Poly-Si Oxide Thin-Film Transistors," IEEE Electron Device Letters, 40(3), pp. 411-414, 2019.

P. Kuo et al., "Low Thermal Budget Amorphous Indium Tungsten Oxide Nano-Sheet Junctionless Transistors with Near Ideal Sub-threshold Swing," 2018 IEEE Symposium on VLSI Technology Digest, pp. 21-22, 2018.

S. Hsu et al., "Flexible Complementary Oxide Thin-Film Transistor-Based Inverter With High Gain," IEEE Transactions on Electron Devices, 68(3), pp. 1070-1074, 2021.

\* cited by examiner

THIN-FILM TRANSISTOR DEVICE

CROSS-REFERENCE TO RELATED APPLICATION

This application claims priority of Taiwanese Invention Patent Application No. 110145689, filed on Dec. 7, 2021.

FIELD

The disclosure relates to a thin-film transistor device, and more particularly to a vertically-stacked thin-film transistor device.

BACKGROUND

Existing display products with a high resolution, such as active-matrix organic light-emitting diode (AMOLED) displays, have backplanes mainly made of a pixel array constituted by polycrystalline silicon (poly-Si) thin-film transistors that have a high electron mobility and a high driving current capability.

In order to improve image resolution, the number of pixels per inch (PPI) in a backplane has to be increased, indicating that the area of each pixel and sizes of the thin-film transistors within the pixel have to be reduced accordingly. However, shrinking of the thin-film transistors is often accompanied by an increase in current leakage, which might lead to an increase in power consumption of a display circuit, thereby resulting in a high power consumption and a poor display quality. The increase in current leakage due to shrinking of the thin-film transistors is especially obvious for a poly-Si thin-film transistor pixel array which is made of poly-Si film(s) with many grain boundaries.

A low temperature poly-Si oxide (LTPO) technology is currently being developed to overcome the technical challenges encountered in the development of high-resolution and/or energy-saving displays, and to accomplish high-resolution AMOLED technology. The LTPO technology adopts a heterogeneous semiconductor structure, i.e., use of low temperature poly-Si (LTPS) thin-film transistors and amorphous oxide semiconductor (AOS) thin-film transistors to form a pixel array which can improve the resolution of display products and reduce operating power consumption.

However, in existing pixel circuit technology that adopts a heterogeneous semiconductor material/structure, a cascade of coplanar thin-film transistors is used. That is, two thin-film transistors and a capacitor (2T1C) are required for forming the heterogeneous structure in existing AMOLED display technology. Hence, with the demand of ultra-high resolution (>2000 ppi) technology, processing/fabrication of the components of display products which continue to shrink would face severe challenges due to limitations of process temperature, lithography technology (cost), and substrate area.

It is noted that an AOS material is suitable for back-end-of-line (BEOL) technology. This is because (i) deposition of the AOS material can be performed at room temperature, (ii) the AOS material has a low thermal budget, and (iii) thin-film transistor made of the AOS material can achieve a low power consumption. Among the AOS material, an indium-gallium-zinc oxide (IGZO) material is the most widely used.

However, the IGZO material does not have a high electron mobility, and cannot achieve a good electrical match when integrated with LTPS thin-film transistors, causing challenges in photolithography mask size (design) and process integration, and leading to increased manufacturing costs. At present, various zinc oxide-based (ZnO-based) materials with improved electron mobility are being developed.

In addition, a single-crystalline silicon process is not suitable for the LTPO technology since the process temperature for forming single-crystalline silicon is too high (>900° C.), which would damage other elements of a structure having the single-crystalline silicon. Thus, the single-crystalline silicon process cannot be used to fabricate a three-dimensional integrated circuit (3D-IC) structure having two or more layers of thin-film transistors, and also cannot be used to fabricate display panels having a glass substrate or a plastic substrate.

SUMMARY

Therefore, an object of the disclosure is to provide a thin-film transistor device that can alleviate at least one of the drawbacks of the prior art.

According to the present disclosure, the thin-film transistor device includes a substrate, a first thin-film structure disposed on the substrate, a gate structure disposed on the first thin-film structure, and a second thin-film structure disposed on the gate structure.

The first thin-film structure includes a channel layer, a first source layer disposed at one side of the channel layer, and a first drain layer disposed at the other side of the channel layer opposite to the first source layer.

The gate structure includes a common gate electrode and a gate insulating layer. The common gate electrode is disposed on and positioned in correspondence with the channel layer of the first thin-film structure. The gate insulating layer wraps the common gate electrode, and covers the first thin-film structure.

The second thin-film structure includes an active layer, a second source layer, and a second drain layer. The active layer includes an indium oxide-based material, is disposed on the gate insulating layer and is positioned in correspondence with the common gate electrode of the gate structure. The second source layer is disposed at one side of the active layer. The second drain layer is disposed at the other side of the active layer opposite to the second source layer, extends through the gate insulating layer, and is electrically connected to the first drain layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
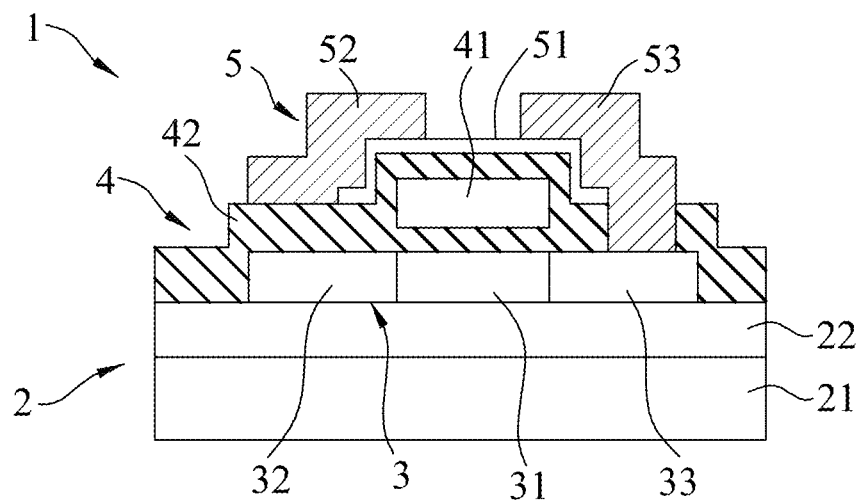
FIG. 1 is a schematic view illustrating an embodiment of a thin-film transistor device in accordance with some embodiments of the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a thin-film transistor device 1 is provided. The thin-film transistor device 1 includes a substrate 2, a first thin-film structure 3 disposed on the substrate 2, a gate structure 4 disposed on the first thin-film structure 3, and a second thin-film structure 5 disposed on the gate structure 4. In this embodiment, the first thin-film structure 3 has a characteristic of a p-type semiconductor, and the second thin-film structure 5 has a characteristic of an n-type semiconductor.

The substrate 2 may include a base 21 and a buffer layer 22 disposed on the base 21. The substrate 2 may be made of a material suitable for a low temperature (about 250° C.) process, such as a semiconductor material, glass, and plastic. In this embodiment, the base 21 is made of silicon (i.e., a semiconductor material) and the buffer layer 22 is made of silicon dioxide ($SiO_2$).

The first thin-film structure 3 includes a channel layer 31 disposed on the buffer layer 22 of the substrate 2, a first source layer 32 disposed at one side of the channel layer 31, and a first drain layer 33 disposed at the other side of the channel layer 31 opposite to the first source layer 32.

The gate structure 4 includes a common gate electrode 41 and a gate insulating layer 42. The common gate electrode 41 is disposed on and positioned in correspondence with the channel layer 31 of the first thin-film structure 3. The gate insulating layer 42 wraps the common gate electrode 41 and covers the first thin-film structure 3.

The second thin-film structure 5 includes an active layer 51, a second source layer 52, and a second drain layer 53. The active layer 51 is disposed on the gate insulating layer 42 and positioned in correspondence with the common gate electrode 41 of the gate structure 4. The second source layer 52 is disposed at one side of the active layer 51. The second drain layer 53 is disposed at the other side of the active layer 51 opposite to the second source layer 52, extends through the gate insulating layer 42, and is electrically connected to the first drain layer 33.

In some embodiments, the first thin-film structure 3 and a part of the common gate electrode 41 adjacent to the first thin-film structure 3 constitute a p-type thin-film transistor, and the second thin-film structure 5 and another part of the common gate electrode 41 adjacent to the second thin-film structure 5 constitute an n-type thin-film structure. That is, the thin-film transistor device 1 is a vertically-stacked complementary thin-film transistor device having a p-type thin-film transistor and an n-type thin-film transistor stacked on each other in one direction.

In some embodiments, each of the channel layer 31, the first source layer 32, and the first drain layer 33 of the first thin-film structure 3 may independently include polycrystalline silicon (e.g., p-type polycrystalline silicon thin film), and may be formed by solid-phase crystallization (SPC), metal-induced crystallization, laser crystallization (LC), or other suitable techniques. Alternatively, in certain embodiments, each of the channel layer 31, the first source layer 32, and the first drain layer 33 of the first thin-film structure 3 may independently include an p-type amorphous oxide semiconductor (AOS) material.

The common gate electrode 41 may be made of a metallic material. Examples of the metallic material may include, but are not limited to, a metal such as molybdenum (Mo), titanium (Ti), palladium (Pd), tungsten (W), cobalt (Co), chromium (Cr), copper (Cu), nickel (Ni), tantalum (Ta), platinum (Pt), gold (Au) and aluminum (Al)); a metal compound such as tungsten titanium (TiW); and a metal nitride such as titanium nitride (TiN) and tantalum nitride (TaN). In this embodiment, the common gate electrode 41 is made of Mo.

In some embodiments, the gate insulating layer 42 is made of a material that has a high dielectric constant (high k). Examples of the high-k material may include, but are not limited to, hafnium oxide ($HfO_2$), aluminum oxide ($Al_2O_3$), lanthanum oxide ($La_2O_3$), zirconium oxide ($ZrO_2$), and hafnium zirconium oxide (HZO) which may include $Hf_{0.5}Zr_{0.5}O_2$. In this embodiment, the gate insulating layer 42 is made of hafnium dioxide ($HfO_2$) and has a thickness of about 10 nm.

The active layer 51 includes an indium oxide-based ($InO_x$-based) material. The indium oxide-based material may have an electron mobility of not less than about 20 $cm^2$/V-s. Examples of the indium oxide-based material may include, but are not limited to, amorphous indium tungsten oxide (a-IWO), amorphous indium zinc oxide (a-IZO), amorphous indium-tungsten-zinc oxide (a-IWZO), amorphous indium-tin-zinc oxide (a-ITZO), amorphous indium tin oxide (a-ITO), amorphous indium oxide (a-InO), or the like. In this embodiment, the active layer 51 is made of amorphous indium tungsten oxide (a-IWO). The active layer may have a thickness that ranges from about 2 nm to about 5 nm.

The second source layer 52 and the second drain layer 53 may be independently made of a metallic material such as a metal (e.g., Mo, Ti, Pd, W, Co, Cr, Cu, Ni, Ta, Pt, Au, Al), a metal compound (e.g., TiW) and a metal nitride (e.g., TiN, TaN), or the like, but not limited thereto. In this embodiment, each of the second source layer 52 and the second drain layer 53 is made of Mo.

In some embodiments, the p-type thin-film transistor (constituted by the first thin-film structure 3 including polycrystalline silicon and the part of the common gate electrode 41) has advantages of, for example, having a high driving current and having a high process compatibility. In some embodiments, in the n-type thin-film transistor (constituted by the second thin-film structure 5 and the another part of the common gate electrode 41), the active layer 51 is an amorphous oxide thin film made of indium oxide-based material, which has the advantages of, for example, having a high film uniformity and a low current leakage. Further, by coupling the n-type thin-film transistor and the p-type thin-film transistor with the gate insulating layer 42 made of a high dielectric constant (high-k) material, the thin-film transistor device 1 has the potential to realize a LTPO structure with high performance, high integration, and low power consumption.

Currently, a widely-used conventional indium gallium zinc oxide (IGZO) n-type thin-film transistor (with an electron mobility of about 8 cm²/V-s to about 10 cm²/V-s) has a relatively low electron mobility and a channel thickness of tens of nanometers (nm), and thus, complex film deposition conditions/parameters and subsequent annealing processes are required to change the conductive properties of the resultant thin film so as to control the channel properties. In certain embodiments, the active layer 51 in the second thin-film structure 5 (n-type) is made of junctionless (JL) amorphous indium tungsten oxide (a-IWO) and does not include the expensive gallium (Ga) element, and thus can be advantageously formed by using a low-cost technology such as radio frequency (RF) sputter deposition. By forming such junctionless structure having an improved gate control capability, the second thin-film structure 5 may exhibit excellent device characteristics and stability. Moreover, since the active layer 51 can be formed as a ultra-thin film (i.e., having a thickness of less than about 5 nm, such as 2.8 nm) and has a high conductivity (with electron mobility of not less than about 24 cm²/V-s), and an excellent subthreshold swing (about 62.5 mV/dec.), the second thin-film structure 5 may further have an improved film uniformity and electrical performance.

In this case, since the electron mobility of the active layer 51 of the second thin-film structure 5 is similar to that of the first thin-film structure 3 (p-type) including polycrystalline silicon, electrical properties of the second thin-film structure 5 and the first thin-film structure 3 are well-matched. Meanwhile, due to similar sizes and layouts of the second thin-film structure 5 and the first thin-film structure 3, design for photolithography mask(s) and operation of the photolithography process can be more precisely controlled/performed, which effectively reduces the number of photolithography masks required (due to use of the junctionless structure). Therefore, the thin-film transistor device 1 of this disclosure may be manufactured in a cost-saving manner via low temperature polycrystalline oxide (LTPO) technology with a high performance, a high integration, and a low power consumption.

It should be noted that since the thin-film transistor device 1 of the present disclosure is formed by directly laminating the second thin-film structure 5 on the first thin-film structure 3 (with only the gate insulating layer 42 disposed therebetween), metal deposition and pattern definition is required to be performed only once for making the common gate electrode 41. In other words, the thin-film transistor device 1 of the present disclosure does not need an interlayer dielectric (ILD) layer, and thus external wiring (which increases production cost) is unnecessary. Moreover, flatness issues that arise for layers stacked on the ILD layer in the conventional thin-film transistor device may be avoided, and subsequent planarization process (e.g., chemical-mechanical planarization (CMP)) to improve the flatness of the layers stacked on the ILD layer can be omitted, which can further decrease production cost.

Figure 2:
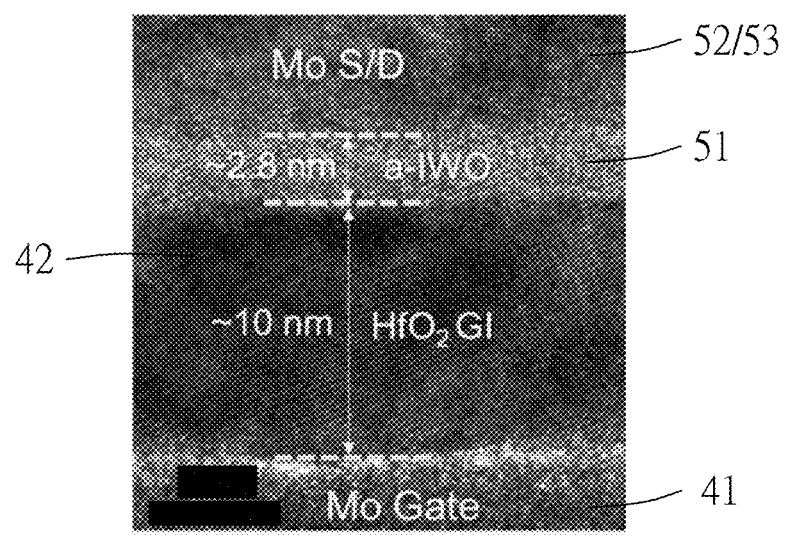
FIG. 2 is a transmission electron microscope (TEM) image of a gate structure and a second thin-film structure in the thin-film transistor device in accordance with some embodiments of the present disclosure.

FIG. 2 is a transmission electron microscope (TEM) image of the n-type thin-film transistor in the thin-film transistor device in accordance with some embodiments of the present disclosure. As shown in FIG. 2, the n-type thin-film transistor is constituted by the second thin-film structure 5 and the another part of the common gate 41. Specifically, the active layer 51 is made of amorphous indium tungsten oxide (a-IWO), and has a minimum measurable thickness of about 2.8 nm.

Figure 3:
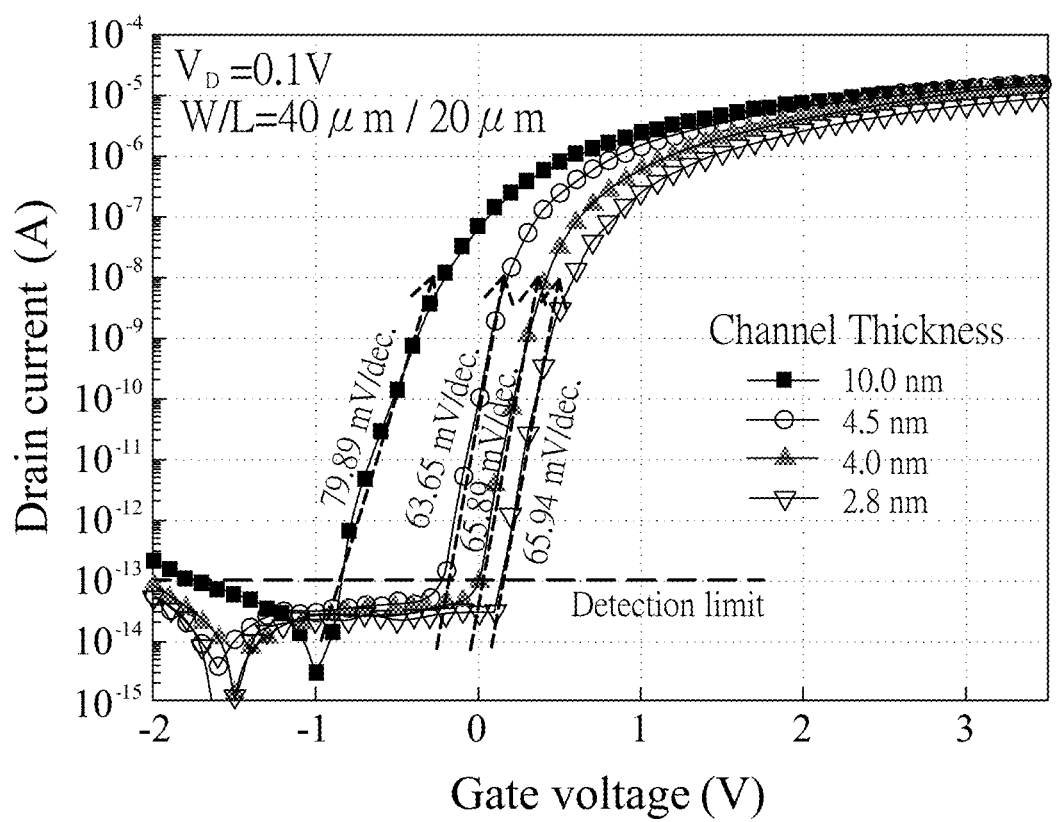
FIG. 3 is a plot illustrating drain current-gate voltage ($I_d$-$V_g$) characteristics of the second thin-film structure of the thin-film transistor devices having active layers with different channel thicknesses in accordance with some embodiments of the present disclosure.

To evaluate the effect of channel thickness of the active layer 51 on the electrical properties of the thin-film transistor device 1, four second thin-film structures 5 which respectively have the active layer 51 with a channel thickness of 2.8 nm, 4.0 nm, 4.5 nm and 10.0 nm were prepared, and then subjected to the determination of drain current-gate voltage ($I_d$-$V_g$) characteristics under a drain voltage ($V_D$) of 0.1 V. As shown in FIG. 3, the four second thin-film structures 5 have subthreshold swing ranging from 63.65 mV/dec. to 79.89 mV/dec., which all meet the industrial requirements. It is also indicated that the second thin-film structures 5 having the active layers 51 with the thicknesses of 4.5 nm, 4.0 nm, and 2.8 nm exhibit superior subthreshold swing. Since the second thin-film structure 5 with the thinnest active layer 51 (i.e., 2.8 nm) has good subthreshold swing, the parameter of 2.8 nm thickness is applied in the experiments of FIGS. 4 and 5. In this case, the optimal composition of the a-IWO for making the active layer 51 may be $In_2O_3$ and $WO_3$ in a weight ratio of 96:4. By doping the active layer 51 with a small amount of tungsten oxide, the electrical performance and stability of the second thin-film transistor 5 in the thin-film transistor device 1 can be effectively improved.

Figure 4:
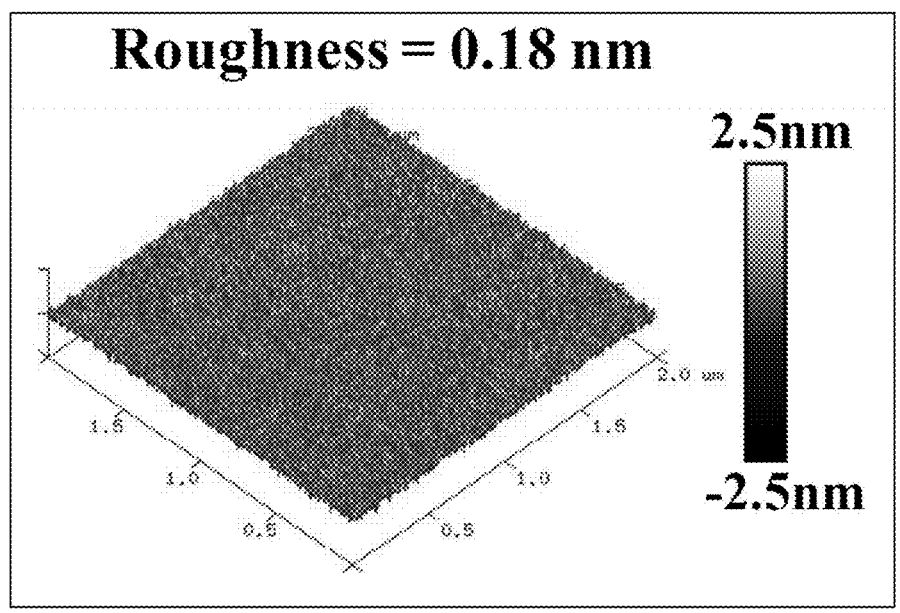
FIG. 4 is an atomic force microscopy (AFM) image illustrating surface characteristics of the active layer of the second thin-film structure of the thin-film transistor device in accordance with some embodiments of the present disclosure.

FIG. 4 is an atomic force microscopy (AFM) image illustrating surface characteristics of the active layer 51 (a-IWO) having a thickness of 2.8 nm. The measured root mean square (Sq) roughness of the active layer 51 is about 0.18 nm, which proves that the active layer 51 has a good uniformity.

Figure 5:
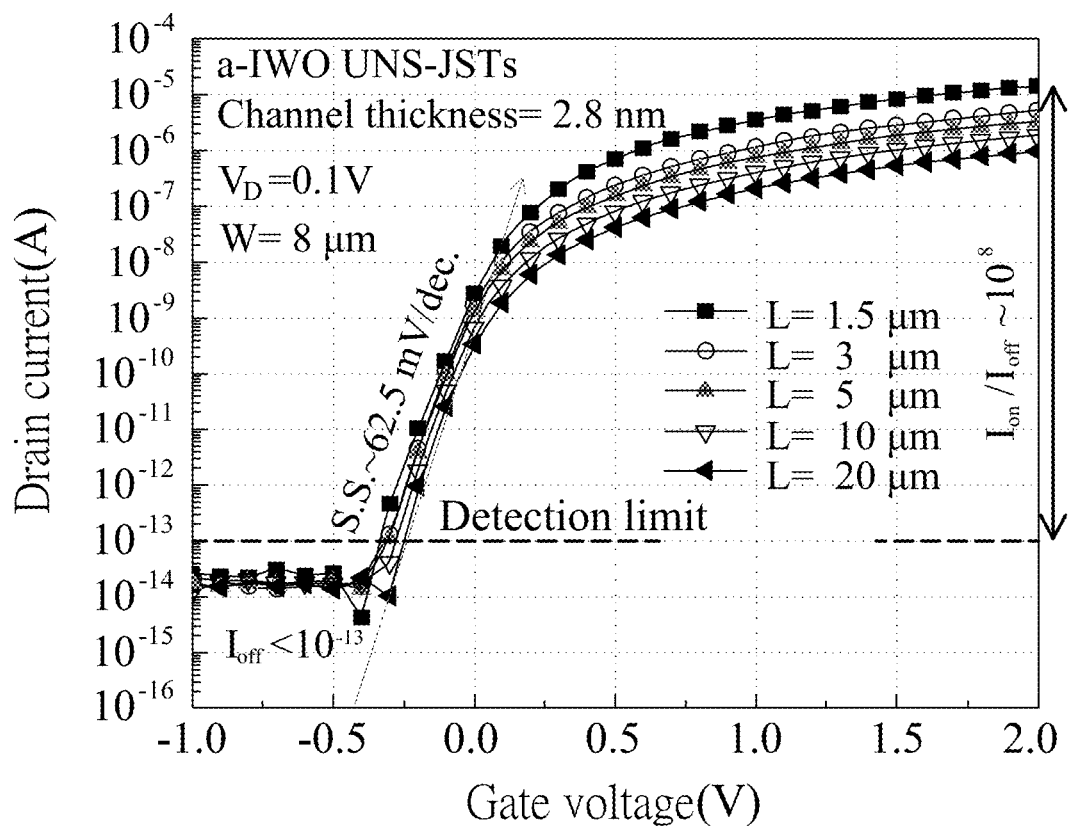
FIG. 5 is a plot illustrating $I_d$-$V_g$ characteristics of the second thin-film structure of the thin-film transistor devices having active layers with different channel lengths in accordance with some embodiments of the present disclosure.

To further evaluate the effect of channel length of the active layer 51 on the electrical properties of the thin-film transistor device 1, five second thin film structures 5 each including the active layer 51 (a-IWO) having a channel thickness of about 2.8 nm, a channel width (W) of 8 μm, and respectively having different channel lengths (L) (i.e., 1.5 μm, 3 μm, 5 μm, 10 μm and 20 μm) were prepared, and then subjected to the determination of $I_d$-$V_g$ characteristics under a drain voltage ($V_D$) of 0.1 V. As shown in FIG. 5, when the channel length is 20 μm, the subthreshold swing (S.S.) can reach about 62.5 mV/dec., and the electron mobility can reach about 24.06 cm²/V-s; when the channel is 1.5 μm, the on-off current ratio ($I_{ON}/I_{OFF}$) of the second thin film structure 5 can reach a value of about $10^8$, indicating that the second thin film transistor 5 of the thin film transistor devices 1 have excellent switching characteristics.

Figure 6:
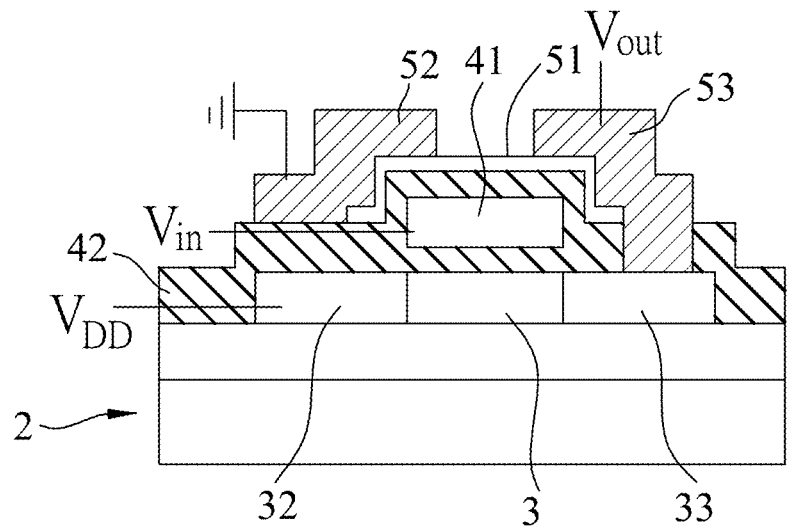
FIG. 6 is a perspective view of the thin-film transistor device functioning as an inverter in accordance with some embodiments of the present disclosure.

Referring to FIG. 6, in some embodiments, the thin-film transistor device 1 functions as an inverter when the common gate electrode 41 is electrically connected to an input voltage supply ($V_{in}$), the second drain layer 53 is electrically connected to an output voltage supply ($V_{out}$), the first source layer 32 is electrically connected to a power source voltage supply ($V_{DD}$), and the second source layer 52 is electrically connected to a ground terminal. With such electrical connections, an inverter circuit (i.e., complementary inverter circuit) is formed. Due to the materials and the configuration of the thin-film transistor device 1, the process for making the thin-film transistor device 1 of the present disclosure has an advantage of a low thermal budget. Thus, when the thin-film transistor device 1 functions as an inverter, energy saving features such as a high voltage gain, a low operating voltage, a good voltage transfer characteristic curve, and a low static power consumption can be readily achieved.

Figure 7:
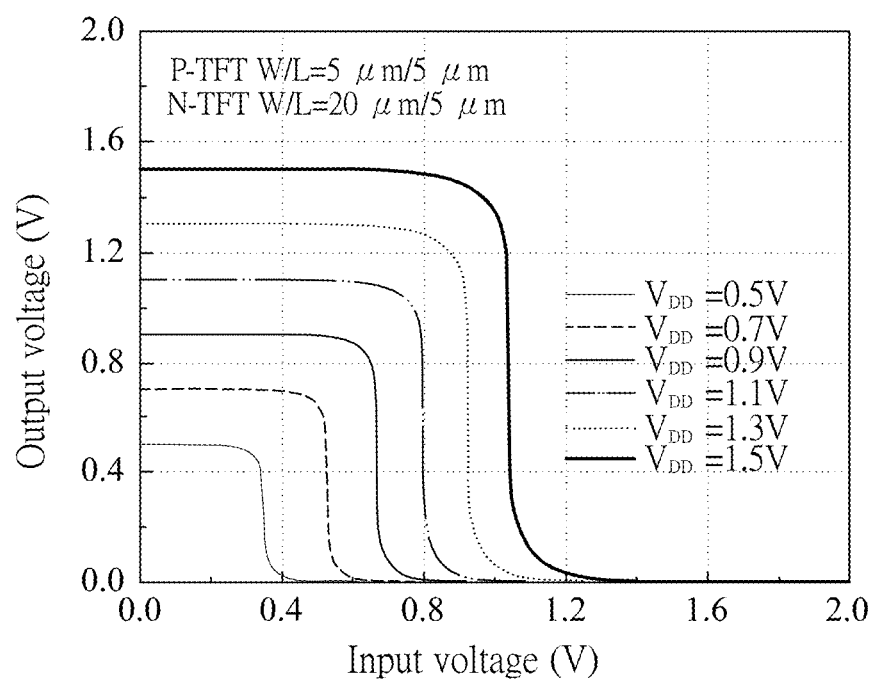
FIG. 7 is a plot illustrating voltage transfer characteristic (VTC) curves when the thin-film transistor device functions as an inverter in accordance with some embodiments of the present disclosure.

FIG. 7 shows the voltage transfer characteristic (VTC) curves of the inverter circuit shown in FIG. 6 under different operating bias voltages ($V_{DD}$ ranging from 0.5 V to 1.5 V). The VTC curves indicate that the inverter circuit of this disclosure can maintain good voltage transfer characteristics at a relatively low operating bias voltages ($V_{DD}$=0.5 V), and achieves an excellent voltage gain (approximately 134 V/V) at a relatively high operating bias voltages ($V_{DD}$=1.5V).

Figure 8:
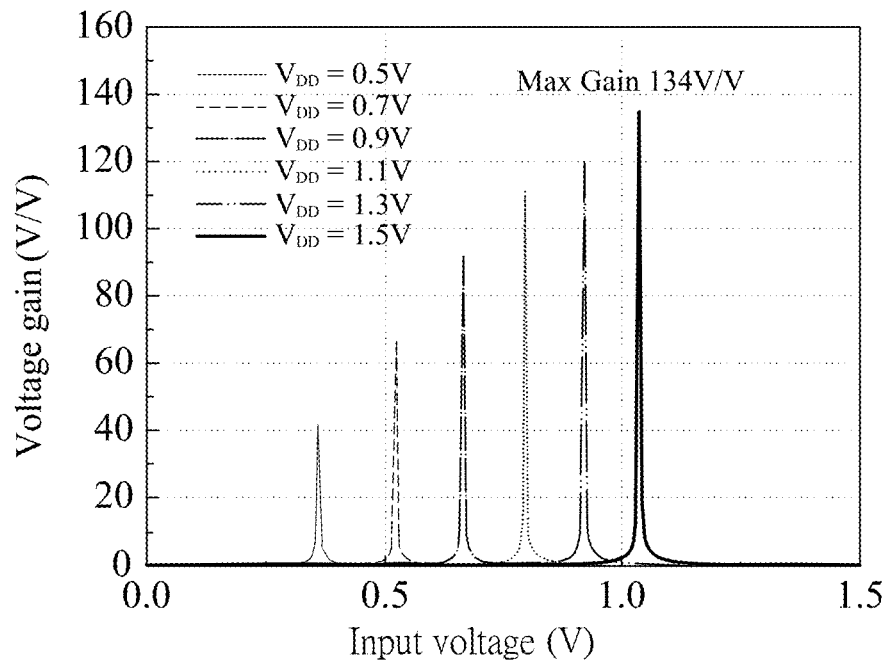
FIG. 8 is a plot of voltage gain versus input voltage when the thin-film transistor device functions as an inverter in accordance with some embodiments of the present disclosure.
Figure 9:
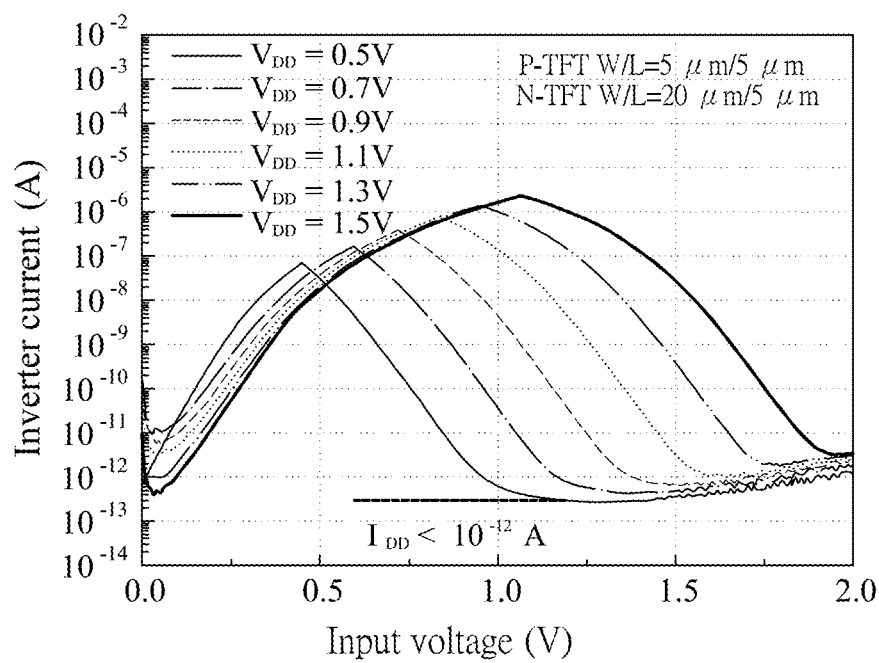
FIG. 9 is a plot of inverter current versus input voltage illustrating static power consumption when the thin-film transistor device functions as an inverter in accordance with some embodiments of the present disclosure.

FIG. 8 shows a relationship of input voltages and voltage gains of the inverter circuit shown in FIG. 6 under different operating bias voltages ($V_{DD}$ ranging from 0.5 V to 1.5 V). As shown in FIG. 8, the voltage gain of the inverter circuit increases as the operating bias voltage increases, indicating that electrical characteristics of the inverter circuit can be stably maintained under different operating bias voltages. In addition, the active layer 51 made of amorphous indium tungsten oxide (a-IWO) has a very low off current. Furthermore, since the first thin-film structure 3 may be formed by a nickel-metal-induced-lateral-crystallization technology with low contamination, the inverter circuit has relatively low inverter current ($I_{DD}$) characteristics. Therefore, the electric current in the inverter circuit can achieve ultra-low static power consumption (about 0.13 pW) (see FIG. 9).

Since the thin-film transistor device 1 functioning as an inverter exhibits a high voltage gain and all process temperatures for manufacturing the same are less than about 500° C., the inverter circuit of the disclosure has a good compatibility with back-end-of line (BEOL) circuits for the emerging monolithic three-dimensional integrated circuit (3D-IC) applications. The inverter circuit can effectively increase density of electronic circuits in a chip, and can serve as a basic unit in digital logic circuits. Therefore, the inverter circuit can be applied to memory devices such as static random access memory (SRAM), NOR flash memory, or key circuit technologies such as oscillators.

Moreover, the thin film transistor device 1 can be integrated into a peripheral circuit of display technology, such as a gate driver to greatly increase the resolution and the refreshing rate of a display. It is noted that the thin-film transistor device 1 of this disclosure has the advantages conferred by both polycrystalline silicon and oxide thin-film transistors, and also compensates their shortcomings. Therefore, the thin-film transistor device 1 can be flexibly used in circuit design of a peripheral circuit of a display to reduce production cost.

Figure 10:
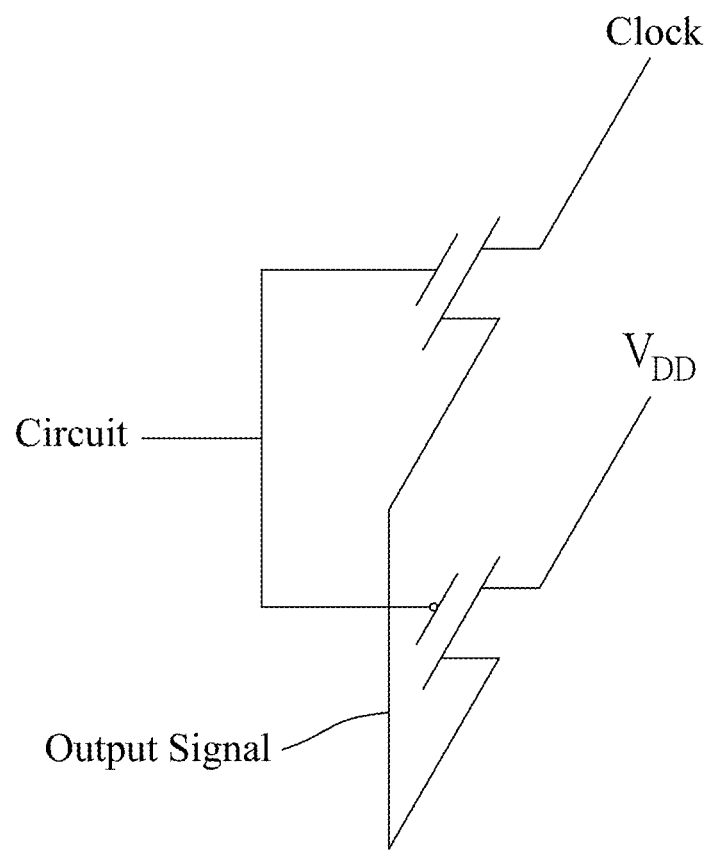
FIG. 10 shows a circuit diagram of the thin-film transistor device applied in a peripheral circuit of a display.

FIG. 10 shows a circuit diagram of the thin-film transistor device 1 applied in a peripheral circuit of a display. In this embodiment, the first source layer 32 is electrically connected to a power source voltage supply ($V_{DD}$), the second source layer 52 is electrically connected to a first signal generator (e.g., clock signal line) to receive a first signal (e.g., clock signal), the common gate electrode 41 is electrically connected to a second signal line to receive a second signal, and the first drain layer 33 outputs an output signal.

In addition, in certain embodiments, by combining the first thin-film structure 3 (which includes the channel layer 31 made of polycrystalline silicon with a high electron mobility) with the second thin-film structure 5 (which includes the active layer 51 made of indium oxide-based material such as amorphous a-IWO and which has a low current leakage and a high uniformity), the peripheral circuit such as gate driver constituted by the thin-film transistor device 1 is conferred with superior characteristics such as a high stability, a high switching speed, and a low power consumption.

In view of the above, the thin-film transistor device 1 of the present disclosure has the advantages described hereinafter. Firstly, with the vertically-stacked arrangement, the thin-film transistor device according to this disclosure has a relatively small size, and the production method thereof is relatively simplified. Moreover, in certain embodiments, by including an indium oxide-based material having an electron mobility of not less than 20 $cm^2$/V-s in the active layer 51 of the second thin-film structure 5 (n-type), a good film uniformity and an improved electrical performance can be achieved. In addition, since the electron mobility of the second thin-film structure 5 is similar to that of the first thin-film structure 3 (p-type), the second thin-film structure 5 and the first-type thin-film structure 3 including polycrystalline silicon (p-type) have good electrical compatibility. Furthermore, by using the gate insulating layer 42 made of a high dielectric constant (high-k) material in combination with the first thin-film structure 3 and the second thin-film structure 5, the thin-film transistor device 1 can further exhibit a good performance and a low operating bias voltage. Therefore, the thin-film transistor device 1 can suitably function as an inverter through circuit connection, or can be applied to a peripheral circuit such as gate driver.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A thin-film transistor device, comprising:
a substrate;
a first thin-film structure disposed on said substrate, and including
   a channel layer containing polycrystalline silicon,
   a first source layer disposed at one side of said channel layer and containing polycrystalline silicon, and
   a first drain layer disposed at the other side of said channel layer opposite to said first source layer and containing polycrystalline silicon;
a gate structure disposed on said first thin-film structure, and including a common gate electrode disposed on and positioned in correspondence with said channel layer of said first thin-film structure, and a gate insulating layer that wraps said common gate electrode and that covers said first thin-film structure; and a second thin-film structure disposed on said gate structure, and including an active layer disposed on said gate insulating layer and positioned in correspondence with said common gate electrode of said gate structure, a second source layer disposed at one side of said active layer, and a second drain layer disposed at the other side of said active layer opposite to said second source layer, wherein said active layer includes an indium oxide-based material that is at least doped with tungsten oxide, said second drain layer extends through said gate insulating layer and is electrically connected to said first drain layer, and said first source layer and said second source layer are electrically insulated by said gate insulating layer.

2. The thin-film transistor device of claim 1, wherein said indium oxide-based material that is at least doped with tungsten oxide has an electron mobility of not less than 24 cm$^2$/V-s.

3. The thin-film transistor device of claim 1, wherein said gate insulating layer is made of a material that has a dielectric constant greater than 3.9 and includes one of hafnium oxide, aluminum oxide, lanthanum oxide, and hafnium zirconium oxide.

4. The thin-film transistor device of claim 1, which functions as an inverter when said common gate electrode is electrically connected to an input voltage supply, said second drain layer is electrically connected to an output voltage supply, said first source layer is electrically connected to a power source voltage supply, and said second source layer is electrically connected to a ground terminal.

5. The thin-film transistor device of claim 1, wherein said first source layer is connected to a power source voltage supply, said second source layer is electrically connected to a first signal line, said common gate electrode is electrically connected to a second signal line, and said first drain layer outputs an output signal.

6. The thin-film transistor device of claim 1, wherein said active layer has a thickness that ranges from 2 nm to 10 nm.

7. The thin-film transistor device of claim 6, wherein said active layer has a thickness that ranges from 2 nm to 5 nm.

8. The thin-film transistor device of claim 1, wherein:

said first thin-film structure and a part of said common gate electrode adjacent to said first thin-film structure constitute a p-type thin-film transistor; and said second thin-film structure and another part of said common gate electrode adjacent to said second thin-film structure constitute an n-type thin-film transistor.

9. The thin-film transistor device of claim 1, wherein said indium oxide-based material is indium tungsten oxide or indium-tungsten-zinc oxide.

10. The thin-film transistor device of claim 9, wherein said indium oxide-based material contains indium oxide ($In_2O_3$) and tungsten oxide ($WO_3$) in a weight ratio of 96:4.

* * * * *